(12) United States Patent
Ota

(10) Patent No.: US 10,522,290 B2
(45) Date of Patent: Dec. 31, 2019

(54) MULTILAYER CERAMIC ELECTRONIC COMPONENT

(71) Applicant: Murata Manufacturing Co., Ltd., Nagaokakyo-shi, Kyoto-fu (JP)

(72) Inventor: Yutaka Ota, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 308 days.

(21) Appl. No.: 15/364,293

(22) Filed: Nov. 30, 2016

(65) Prior Publication Data
US 2017/0162328 A1 Jun. 8, 2017

(30) Foreign Application Priority Data
Dec. 3, 2015 (JP) .................. 2015-236242

(51) Int. Cl.
*H01L 41/04* (2006.01)
*H01G 4/30* (2006.01)
(Continued)

(52) U.S. Cl.
CPC .............. *H01G 4/30* (2013.01); *H01C 1/148* (2013.01); *H01C 7/008* (2013.01); *H01F 27/24* (2013.01); *H01F 27/2804* (2013.01); *H01G 4/012* (2013.01); *H01G 4/1227* (2013.01); *H01G 4/228* (2013.01); *H01L 41/0471* (2013.01); *H01L 41/0472* (2013.01); *H01L 41/083* (2013.01); *H01L 41/1871* (2013.01); *H01L 41/1876* (2013.01); *H01F 2027/2809* (2013.01)

(58) Field of Classification Search
CPC .............. H01L 41/0471; H01L 41/0472; H01L 41/083; H01L 41/1871; H01L 41/1876

USPC .......................... 310/328, 365, 366
See application file for complete search history.

(56) References Cited

U.S. PATENT DOCUMENTS

| | | | |
|---|---|---|---|
| 2014/0029158 A1 | 1/2014 | Inoue et al. | |
| 2014/0292141 A1* | 10/2014 | Nishisaka | H01F 17/0013 310/311 |
| 2016/0240310 A1* | 8/2016 | Kim | H01G 4/012 |

FOREIGN PATENT DOCUMENTS

| | | |
|---|---|---|
| JP | 8-69938 A | 3/1996 |
| JP | 10-208979 A | 8/1998 |

(Continued)

OTHER PUBLICATIONS

Official Communication issued in Korean Patent Application No. 10-2016-0156354, dated Apr. 12, 2018.

*Primary Examiner* — Derek J Rosenau
(74) *Attorney, Agent, or Firm* — Keating & Bennett, LLP

(57) ABSTRACT

A multilayer ceramic capacitor a multilayer body including ceramic layers and principal surfaces opposing each other, side surfaces opposing each other, and end surfaces opposing each other, the principal surface defining and functioning as a mounting surface; an inner electrode located within the multilayer body and partially extended to the principal surface; an outer electrode located on the principal surface and connected to the inner electrode. The outer electrode includes outer electrode side surface portions located also on portions of the side surfaces. When a length of the outer electrode side surface portions in a direction connecting the principal surfaces is indicated by A, and a length of the multilayer body in the direction connecting the principal surfaces is indicated by B, 0.063≤A/B≤1.000 is satisfied.

16 Claims, 6 Drawing Sheets

(51) Int. Cl.

| | |
|---|---|
| *H01C 1/148* | (2006.01) |
| *H01C 7/00* | (2006.01) |
| *H01F 27/24* | (2006.01) |
| *H01F 27/28* | (2006.01) |
| *H01G 4/012* | (2006.01) |
| *H01G 4/12* | (2006.01) |
| *H01G 4/228* | (2006.01) |
| *H01L 41/047* | (2006.01) |
| *H01L 41/083* | (2006.01) |
| *H01L 41/187* | (2006.01) |

(56) References Cited

FOREIGN PATENT DOCUMENTS

| JP | 10-289837 A | 10/1998 |
|---|---|---|
| JP | 2011-228326 A | 11/2011 |
| JP | 2012-204441 A | 10/2012 |
| WO | 2012/137569 A1 | 10/2012 |

\* cited by examiner

FIG. 7A
TEST SAMPLE 1-1
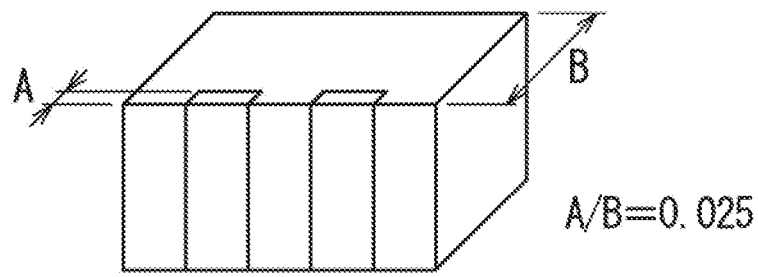
A/B=0.025
FIG. 7B    TEST SAMPLE 1-3
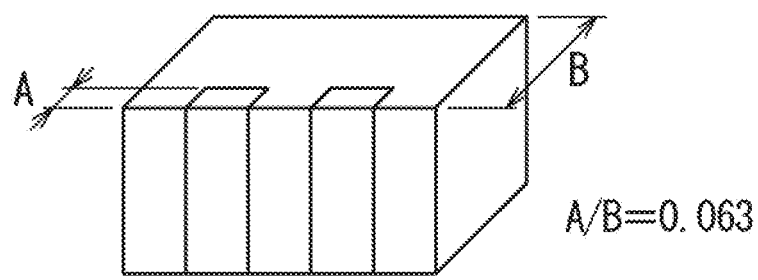
A/B=0.063
FIG. 7C    TEST SAMPLE 1-11
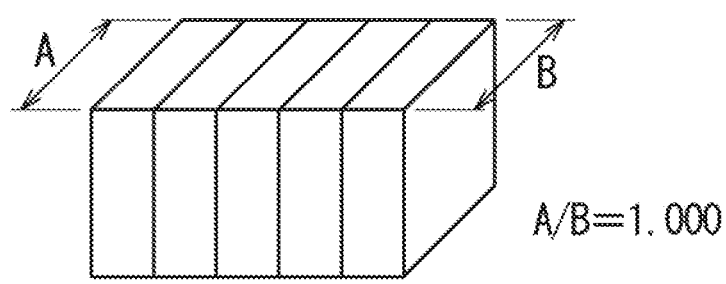
A/B=1.000

FIG. 8
Prior Art    1
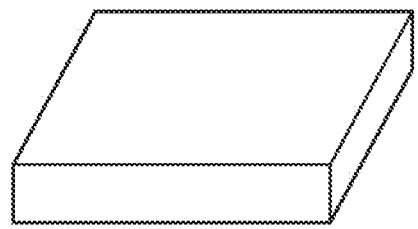
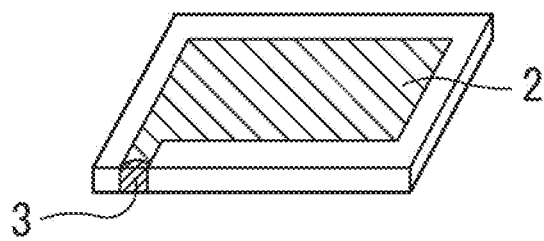
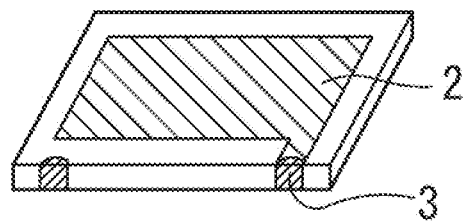
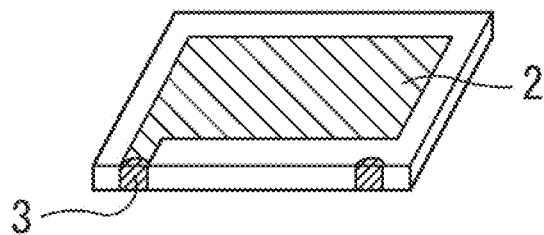
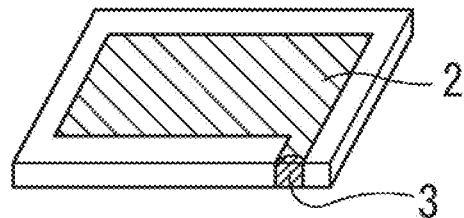

MULTILAYER CERAMIC ELECTRONIC COMPONENT

CROSS REFERENCE TO RELATED APPLICATIONS

This application claims the benefit of priority to Japanese Patent Application No. 2015-236242 filed on Dec. 3, 2015. The entire contents of this application are hereby incorporated herein by reference.

BACKGROUND OF THE INVENTION

1. Field of the Invention

The present invention relates to a multilayer ceramic electronic component, for example, a multilayer ceramic capacitor.

2. Description of the Related Art

In recent years, mobile electronic devices have been reduced in size. A mobile electronic device is equipped with multiple multilayer ceramic electronic components. In accordance with size reduction of mobile electronic devices, size reduction is also demanded for multilayer ceramic electronic components. Further, for a multilayer ceramic electronic component including outer electrodes formed on both end surfaces of a multilayer body including inner electrodes, in order to mount the multilayer ceramic electronic component on a wiring pattern of a circuit board, it is necessary to form, between the outer electrode and the wiring pattern, a solder fillet that spreads like the foot of a mountain. Thus, it is necessary to form the wiring pattern of the circuit board such that the size thereof is increased by an amount for the solder fillet from the end surface of the multilayer ceramic electronic component, so that a space to mount the multilayer ceramic electronic component becomes large. However, in accordance with size reduction of mobile electronic devices, in addition to size reduction of multilayer ceramic electronic components, the intervals between components mounted on a circuit board are required to be decreased to make a space to mount the components small.

Thus, there is a multilayer ceramic electronic component 1 in which, as shown in FIG. 8, inner electrodes 2 are formed to be perpendicular to a mounting surface to a circuit board and are extended to outer electrodes 3 formed on the mounting surface. It is possible to mount such a multilayer ceramic electronic component 1 on a wiring pattern of a circuit board by the outer electrode 3 formed on one mounting surface. Thus, a solder fillet that spreads from an end portion to an outer side portion of the multilayer ceramic electronic component is not necessary, and it is possible to make a space to mount the multilayer ceramic electronic component 1 small (see Japanese Unexamined Patent Application Publication No. 10-289837).

However, with the multilayer ceramic electronic component including a shape as disclosed in Japanese Unexamined Patent Application Publication No. 10-289837, for example, due to stress generated when solder is wetted and solidified in mounting the multilayer ceramic electronic component, it is not possible to sufficiently reduce or prevent tilt of the multilayer ceramic electronic component, and the multilayer ceramic electronic component is tilted after being mounted, resulting in a problem with appearance or a problem of a decrease in fixing strength in a certain direction.

SUMMARY OF THE INVENTION

According to preferred embodiments of the present invention, tilting of a multilayer ceramic electronic component is significantly reduced or prevented when the multilayer ceramic electronic component is mounted on a circuit board.

According to a preferred embodiment of the present invention, a multilayer ceramic electronic component includes: a multilayer body including a plurality of laminated ceramic layers and including a first principal surface and a second principal surface opposing each other, a first side surface and a second side surface opposing each other in a lamination direction, and a first end surface and a second end surface opposing each other, the first principal surface or the second principal surface defining and functioning as a mounting surface; a first inner electrode located within the multilayer body and partially extended to only one of the first or second principal surface at the first end surface side; a second inner electrode located within the multilayer body and partially extended to only one of the first or second principal surface at the second end surface side at a position different from that of the first inner electrode; a first outer electrode located on the first or second principal surface and connected to the first inner electrode; and a second outer electrode located on the first or second principal surface and connected to the second inner electrode. The first outer electrode includes a first outer electrode side surface portion located on the first or second principal surface and portions of the first side surface and the second side surface; the second outer electrode includes a second outer electrode side surface portion located on the first or second principal surface and portions of the first side surface and the second side surface; and $0.063 \leq A/B \leq 1.000$ is satisfied when a length of the first outer electrode side surface portion and the second outer electrode side surface portion in a direction connecting the first principal surface and the second principal surface is indicated by A and a length of the multilayer body in the direction connecting the first principal surface and the second principal surface is indicated by B.

According to a preferred embodiment of the present invention, a multilayer ceramic electronic component includes: a multilayer body including a plurality of laminated ceramic layers and including a first principal surface and a second principal surface opposing each other, a first side surface and a second side surface opposing each other in a lamination direction, and a first end surface and a second end surface opposing each other, the first principal surface or the second principal surface defining and functioning as a mounting surface; a first inner electrode located within the multilayer body and partially extended to the first and second principal surfaces at the first end surface side; a second inner electrode located within the multilayer body and partially extended to the first and second principal surfaces at the second end surface side at a position different from that of the first inner electrode; a first outer electrode located on the first and second principal surfaces and connected to the first inner electrode; and a second outer electrode located on the first and second principal surfaces and connected to the second inner electrode. The first outer electrode includes a first outer electrode side surface portion located on the first and second principal surfaces and portions of the first side surface and the second side surface; the second outer electrode includes a second outer electrode side surface portion located on the first and second principal surfaces and portions of the first side surface and the second side surface; and $0.063 \leq A/B \leq 1.000$ is satisfied when a length of the first outer electrode side surface portion and the second outer electrode side surface portion in a direction connecting the first principal surface and the second principal surface is indicated by A and a length of the multilayer body in the direction connecting the first principal surface and the second principal surface is indicated by B.

In a multilayer ceramic electronic component according to a preferred embodiment of the present invention, $0.11 \leq C/D \leq 0.49$ is preferably satisfied when a length of the first outer electrode side surface portion and the second outer electrode side surface portion in a direction connecting the first end surface and the second end surface is indicated by C and a length of the multilayer body in the direction connecting the first end surface and the second end surface is indicated by D.

In a multilayer ceramic electronic component according to a preferred embodiments of the present invention, $0.063 \leq A/B \leq 1.000$ is satisfied when the length of the first outer electrode side surface portion and the second outer electrode side surface portion located on the first side surface and the second side surface of the multilayer body in the direction connecting the first principal surface and the second principal surface is indicated by A and the length of the multilayer body in the direction connecting the first principal surface and the second principal surface is indicated by B. Thus, tilt of the multilayer ceramic electronic component when the multilayer ceramic electronic component is mounted on a circuit board or the like is able to be significantly reduced or prevented.

As a result of providing the first outer electrode side surface portion and the second outer electrode side surface portion on each side surface, a down force acts when a joining material melts in mounting the multilayer ceramic electronic component. Accordingly, the attitude of the multilayer ceramic electronic component is able to be stabilized.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 7A is an external perspective view of a multilayer ceramic capacitor of test sample 1-1 included in Experimental Example 1.

FIG. 7B is an external perspective view of a multilayer ceramic capacitor of test sample 1-3 included in Experimental Example 1.

FIG. 7C is an external perspective view of a multilayer ceramic capacitor of test sample 1-11 included in Experimental Example 1.

FIG. 8 is an exploded perspective view showing an example of a multilayer ceramic capacitor in the related art.

DETAILED DESCRIPTION OF THE PREFERRED EMBODIMENTS

First Preferred Embodiment

Figure 1:
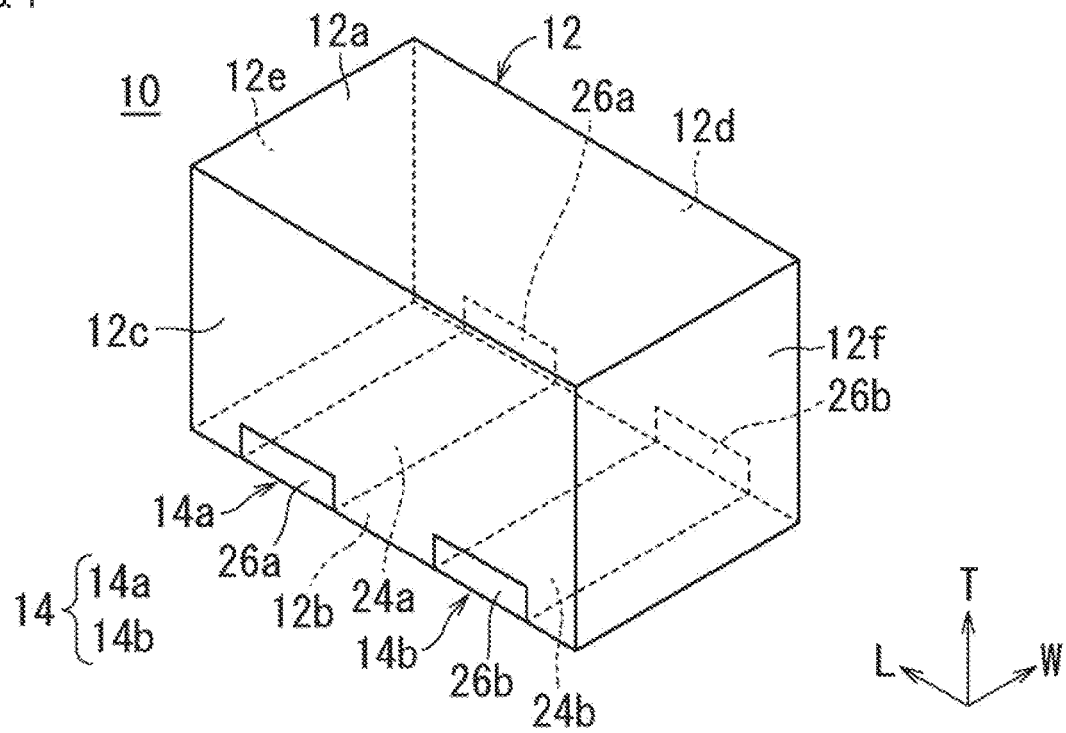
FIG. 1 is an external perspective view showing a multilayer ceramic capacitor according to a first preferred embodiment of the present invention.
Figure 2:
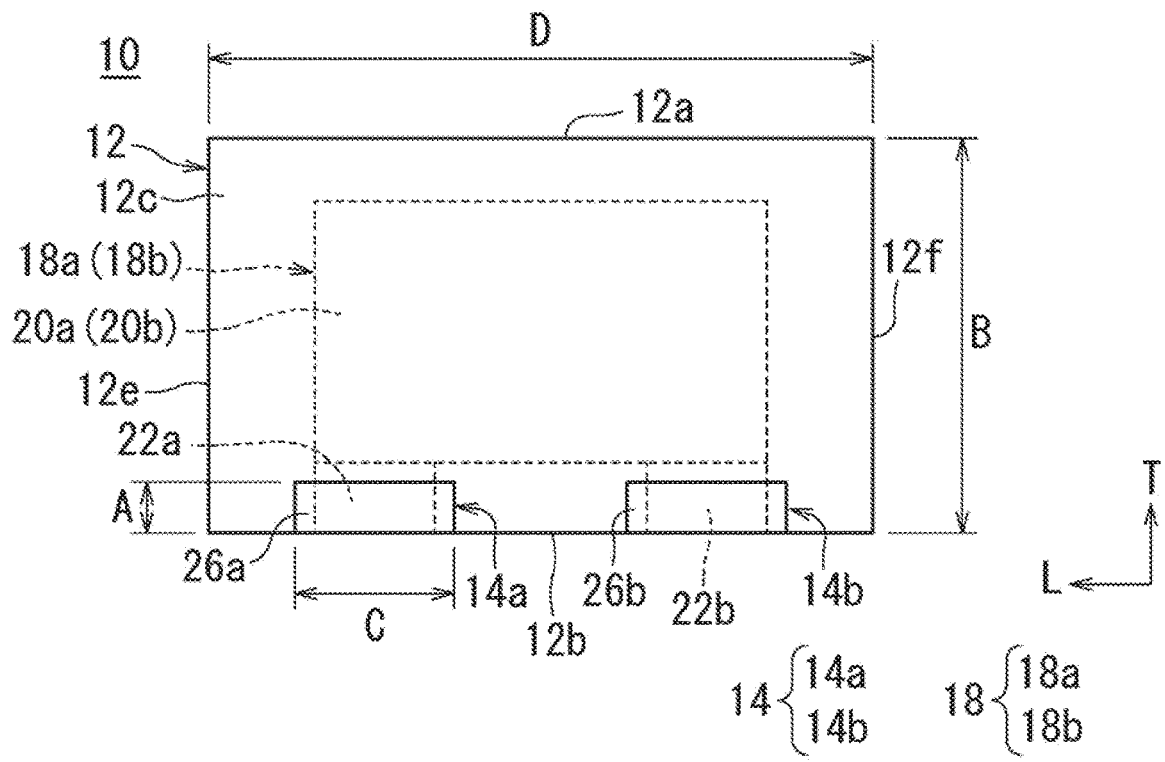
FIG. 2 is a front view of the multilayer ceramic capacitor shown in FIG. 1.
Figure 3:
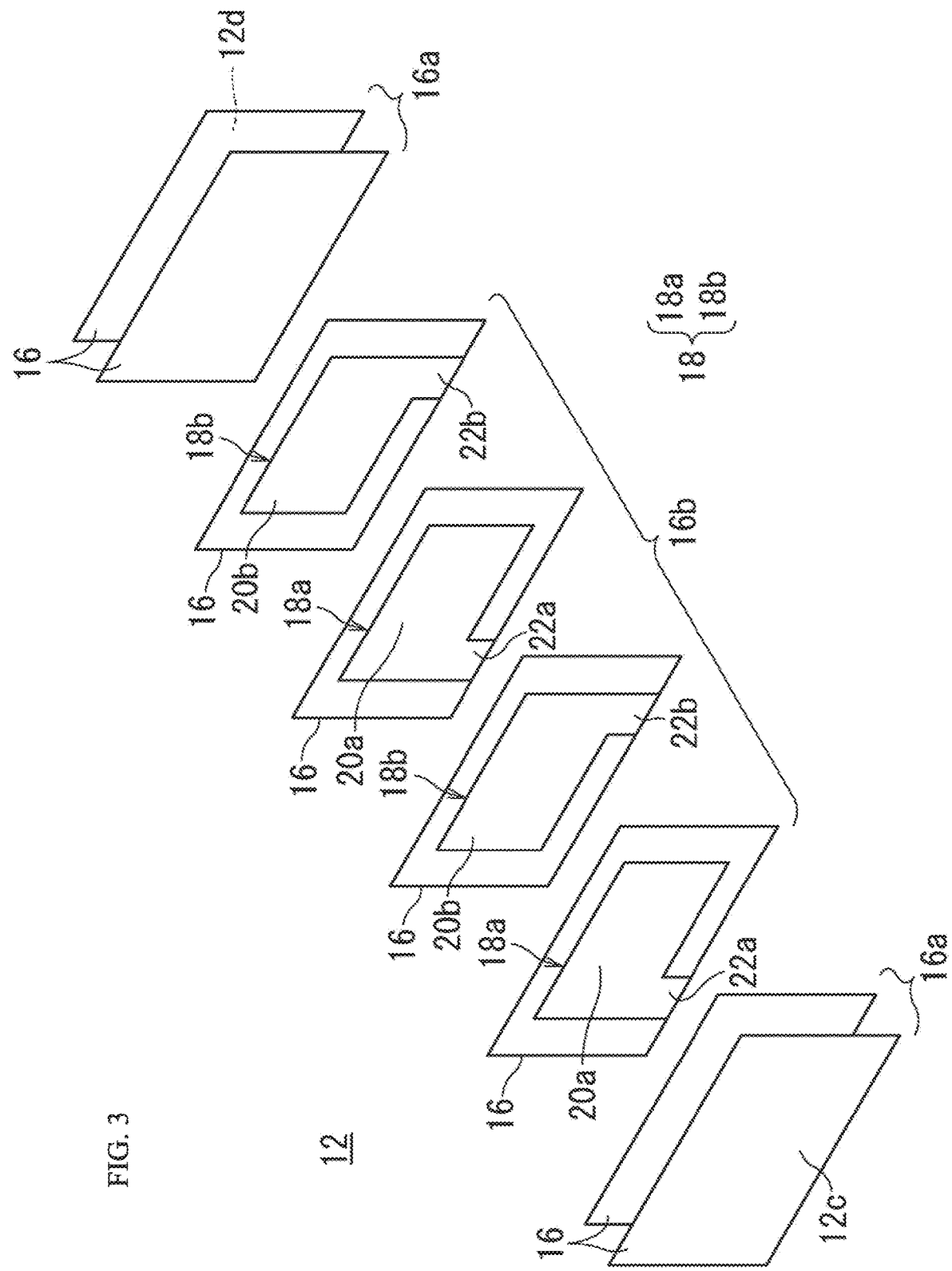
FIG. 3 is an exploded perspective view of a multilayer body shown in FIGS. 1 and 2.

A multilayer ceramic electronic component according to a first preferred embodiment of the present invention is described below. In the first preferred embodiment, a multilayer ceramic capacitor is shown as an example of the multilayer ceramic electronic component. FIG. 1 is an external perspective view showing the multilayer ceramic capacitor according to the first preferred embodiment. FIG. 2 is a front view of the multilayer ceramic capacitor shown in FIG. 1. FIG. 3 is an exploded perspective view of a multilayer body shown in FIGS. 1 and 2.

The multilayer ceramic capacitor 10 includes a multilayer body 12 with a rectangular or substantially rectangular parallelepiped shape and an outer electrode 14.

The multilayer body 12 includes a plurality of ceramic layers 16 and a plurality of inner electrodes 18. The multilayer body 12 includes a first principal surface 12a and a second principal surface 12b opposing each other, a first side surface 12c and a second side surface 12d opposing each other in a lamination direction, and a first end surface 12e and a second end surface 12f opposing each other. Each of the first principal surface 12a and the second principal surface 12b extends along a length direction L and a width direction W. Each of the first side surface 12c and the second side surface 12d extends along the length direction L and a thickness direction T. Each of the first end surface 12e and the second end surface 12f extends along the width direction W and the thickness direction T. The first principal surface 12a and the second principal surface 12b refer to surfaces parallel or substantially parallel to a surface (mounting surface) on which the multilayer ceramic capacitor 10 is mounted. Therefore, the length direction L is a direction connecting a pair of the end surfaces, the width direction W is a direction connecting a pair of the side surfaces, and the thickness direction T is a direction connecting a pair of the principal surfaces.

The corners and the edge portions of the multilayer body 12 are preferably rounded, for example. Each corner is a portion at which three surfaces of the multilayer body 12 intersect each other, and each edge portion is a portion at which two surfaces of the multilayer body 12 intersect each other.

The ceramic layers 16 include outer layer portions 16a and an inner layer portion 16b. The outer layer portions 16a include the ceramic layers 16 that are located at the first side surface 12c side of the multilayer body 12 and between the first side surface 12c and the inner electrode 18 closest to the first side surface 12c, and the ceramic layers 16 that are located at the second side surface 12d side of the multilayer body 12 and between the second side surface 12d and the inner electrode 18 closest to the second side surface 12d. Each outer layer portion 16a preferably includes a thickness of not less than about 18 μm, for example. The region between both outer layer portions 16a is the inner layer portion 16b.

Each ceramic layer 16 includes, for example, a dielectric material. As the dielectric material, for example, a dielectric ceramic material including a component, for example, $BaTiO_3$, $CaTiO_3$, $SrTiO_3$, or $CaZrO_3$. If a dielectric material is included as a principal component, a material including a secondary component, for example, a Mn compound, a Fe compound, a Cr compound, a Co compound, and a Ni compound, may be added in an amount lower than that of the principal component in accordance with the characteristics of the desired multilayer ceramic capacitor 10.

If a piezoelectric ceramic material is included in the multilayer body 12, the multilayer ceramic electronic component defines and functions as a ceramic piezoelectric element. Specific examples of the piezoelectric ceramic material include a PZT material.

If a semiconductor ceramic material is included in the multilayer body 12, the multilayer ceramic electronic component defines and functions as a thermistor element. Specific examples of the semiconductor ceramic material include a spinel ceramic material.

If a magnetic ceramic material is included in the multilayer body 12, the multilayer ceramic electronic component defines and functions as an inductor element. If the multilayer ceramic electronic component defines and functions as an inductor element, each inner electrode 18 is a conductor with a coil or a substantially coil shape. Specific examples of the magnetic ceramic material include a ferrite ceramic material.

A thickness of each ceramic layer 16 after baking is preferably not less than about 0.5 μm and not greater than about 2 μm, for example.

As shown in FIGS. 2 and 3, the multilayer body 12 includes a plurality of first inner electrodes 18a and a plurality of second inner electrodes 18b as the plurality of inner electrodes 18. Each first inner electrode 18a includes a first opposing electrode portion 20a opposing the first side surface 12c and the second side surface 12d, and is laminated in a direction connecting the first side surface 12c and the second side surface 12d. Each second inner electrode 18b includes a second opposing electrode portion 20b opposing the first side surface 12c and the second side surface 12d, and is laminated in the direction connecting the first side surface 12c and the second side surface 12d. Therefore, the first inner electrodes 18a and the second inner electrodes 18b are located perpendicular or substantially perpendicular to the first principal surface 12a and the second principal surface 12b of the multilayer body 12. The first inner electrodes 18a and the second inner electrodes 18b are laminated alternately with each other within the multilayer body 12, and the first opposing electrode portions 20a of the first inner electrodes 18a and the second opposing electrode portions 20b of the second inner electrodes 18b oppose each other.

Auxiliary electrodes may be formed on layers at which the first inner electrodes 18a are located and on layers at which the second inner electrodes 18b are located, for example.

Each first inner electrode 18a extends to the second principal surface 12b of the multilayer body 12 by a first extended electrode portion 22a. The first extended electrode portion 22a extends to the first end surface 12e side of the multilayer body 12. Each second inner electrode 18b extends to the second principal surface 12b of the multilayer body 12 by a second extended electrode portion 22b. The second extended electrode portion 22b extends to the second end surface 12f side of the multilayer body 12 and spaced apart from the first extended electrode portion 22a. The first inner electrodes 18a and the second inner electrodes 18b are not exposed on the first principal surface 12a, side surfaces 12c and 12d, and end surfaces 12e and 12f of the multilayer body 12.

The first extended electrode portions 22a of the first inner electrodes 18a may extend to only the first principal surface 12a. Correspondingly, the second extended electrode portions 22b of the second inner electrodes 18b extend to only the first principal surface 12a.

The multilayer body 12 includes side portions (gaps) formed between one end, in the length direction L, of each first opposing electrode portion 20a and the first end surface 12e and between the other end, in the length direction L, of each first opposing electrode portion 20a and the second end surface 12f. Similarly, the multilayer body 12 includes side portions (gaps) formed between one end, in the length direction L, of each second opposing electrode portion 20b and the first end surface 12e and between the other end, in the length direction L, of each second opposing electrode portion 20b and the second end surface 12f.

Furthermore, the multilayer body 12 includes end portions (gaps) between the second principal surface 12b and an end portion of each first inner electrode 18a opposite to the extended electrode portion 22a and between the first principal surface 12a and an end portion of each second inner electrode 18b opposite to the extended electrode portion 22b.

Each of the first inner electrodes 18a and the second inner electrodes 18b may include, as a material, a metal, for example, Ni, Cu, Ag, Pd, and Au, or an alloy including one of these metals, for example, an Ag—Pd alloy. Each of the first inner electrodes 18a and the second inner electrodes 18b may include dielectric particles with the same or substantially the same composition as the ceramic material included in the ceramic layers 16. A thickness of each of the first inner electrodes 18a and the second inner electrodes 18b is preferably not less than about 0.1 μm and not greater than about 2.0 μm, for example.

The outer electrode 14 is formed on the second principal surface 12b of the multilayer body 12. The outer electrode 14 includes a first outer electrode 14a electrically connected to the first extended electrode portions 22a and a second outer electrode 14b electrically connected to the second extended electrode portions 22b.

Within the multilayer body 12, electric characteristics (for example, an electrostatic capacitance) occur because the first opposing electrode portions 20a and the second opposing electrode portions 20b oppose each other across the ceramic layers 16. Thus, an electrostatic capacitance between the first outer electrode 14a, to which the first inner electrodes 18a are connected, and the second outer electrode 14b, to which the second inner electrodes 18b are connected, is able to be obtained. Therefore, the multilayer ceramic electronic component including the structure described above defines and functions as a capacitor.

The first outer electrode 14a includes a first outer electrode principal surface portion 24a located on the second principal surface 12b and first outer electrode side surface portions 26a extending from the first outer electrode principal surface portion 24a and located on the first side surface 12c and the second side surface 12d, respectively.

The second outer electrode 14b includes a second outer electrode principal surface portion 24b located on the second principal surface 12b and second outer electrode side surface portions 26b extending from the second outer electrode principal surface portion 24b and located on the first side surface 12c and the second side surface 12d, respectively.

The first outer electrode principal surface portion 24a of the first outer electrode 14a is located on the second principal surface 12b of the multilayer body 12 and along the first end surface 12e. In addition, the second outer electrode principal surface portion 24b of the second outer electrode 14b is located along the second end surface 12f and spaced apart from the first outer electrode principal surface portion 24a.

When the length of the first outer electrode side surface portion 26a and the second outer electrode side surface portion 26b in a direction connecting the first principal surface 12a and the second principal surface 12b is indicated by A, and the length of the multilayer body 12 in the direction connecting the first principal surface 12a and the second principal surface 12b is indicated by B, 0.063≤A/B≤1.000 is satisfied. By setting the range of A/B to 0.063≤A/B≤1.000, tilt of the multilayer ceramic capacitor 10 when the multilayer ceramic capacitor 10 is mounted on a circuit board or the like is able to be significantly reduced or prevented. As a result of providing the first outer electrode side surface portion 26a and the second outer electrode side surface portion 26b on each side surface, a down force acts when a joining material melts in mounting the multilayer ceramic capacitor 10. Accordingly, the attitude of the multilayer ceramic capacitor 10 is able to be stabilized. In addition, from the standpoint of compact mounting, by setting the range of A/B to 0.063≤A/B≤0.438, wetting-up of the joining material to the multilayer ceramic capacitor 10 when the multilayer ceramic capacitor 10 is mounted on the circuit board or the like is able to be significantly reduced or prevented, and a space to mount the multilayer ceramic capacitor 10 is able to be reduced.

The process for measuring the dimension A and the dimension B is described below.

First, the multilayer ceramic capacitor 10 is observed with a microscope, and the height (dimension A) of a central portion, in the length direction L, of each of the first outer electrode side surface portion 26a and the second outer electrode side surface portion 26b of the multilayer ceramic capacitor 10 and the height (dimension B) of a central portion, in the length direction L, of the first side surface 12c of the multilayer body 12 are measured by performing a dimension measuring operation.

If the second principal surface 12b of the multilayer body 12 is located at the lower side and the first side surface 12c is seen, a normal line is created with respect to a parallel or substantially parallel line based on the first principal surface 12a and the second principal surface 12b, and the dimension A and the dimension B parallel or substantially parallel to the normal line are measured. The dimension A is defined as the average of the value of the first outer electrode side surface portion 26a and the value of the second outer electrode side surface portion 26b.

When the length of the first outer electrode side surface portion 26a and the second outer electrode side surface portion 26b in a direction connecting the first end surface 12e and the second end surface 12f is indicated by C, and the length of the multilayer body 12 in the direction connecting the first end surface 12e and the second end surface 12f is indicated by D, 0.11≤C/D≤0.49 is satisfied. When C/D is less than about 0.11, a down force acting when the joining material melts does not occur with respect to the size of the multilayer ceramic capacitor 10, tilt of the multilayer ceramic capacitor 10 when the multilayer ceramic capacitor 10 is mounted on the circuit board is not able to be significantly reduced or prevented. When C/D is greater than about 0.49, an electrode including a length equal or substantially equal to half the side surface length of the multilayer body has to be formed, but is not able to be formed due to a structural reason, for example, due to a short circuit occurring.

The process for measuring the dimension C and the dimension D is described below.

First, while the multilayer ceramic capacitor 10 is observed with a microscope, and the length (dimension C) at the position of ½ of the height of a central portion, in the length direction L, of each of the first outer electrode side surface portion 26a and the second outer electrode side surface portion 26b of the multilayer ceramic capacitor 10 and the length (dimension D) of the multilayer body 12 in the length direction L are measured by a dimension measuring operation.

If the first principal surface 12a or the second principal surface 12b is seen, a first normal line is created with respect to the first side surface 12c and the second side surface 12d, further a second normal line is created with respect to the first normal line, and the dimension C and the dimension D parallel or substantially parallel to the second normal line are measured. The dimension C is defined as the average of the value of the first outer electrode side surface portion 26a and the value of the second outer electrode side surface portion 26b.

The outer electrode 14 preferably includes a base electrode layer and a plating layer in order from the multilayer body 12 side, for example. The base electrode layer includes at least one selected from a baked layer, a resin layer, and a thin film layer, etc. Here, a base electrode layer formed of a baked layer is described below.

The baked layer includes glass and metal. Examples of the metal of the baked layer include at least one selected from Cu, Ni, Ag, Pd, an Ag—Pd alloy, Au, and the like. The baked layer may include a plurality of layers, for example. The baked layer is formed by applying a conductive paste including the glass and the metal to the multilayer body 12 and baking the conductive paste. The baked layer may be baked simultaneously or substantially simultaneously with the ceramic layers 16 and the inner electrodes 18, or may be baked after the ceramic layers 16 and the inner electrodes 18 are baked. A thickest portion of the baked layer preferably includes a thickness of not less than about 10 μm and not greater than about 50 μm, for example.

A resin layer including conductive particles and a thermosetting resin may be formed on the surface of the baked layer. The resin layer may be formed directly on the multilayer body 12 without forming a baked layer, for example. In addition, the resin layer may include a plurality of layers, for example. A thickest portion of the resin layer preferably includes a thickness of not less than about 10 μm and not greater than about 150 μm, for example.

The thin film layer is formed by a thin film forming method such as sputtering or vapor deposition, and is a layer of about 1 μm or smaller obtained by accumulation of metal particles.

The plating layer preferably includes, for example, one metal selected from Cu, Ni, Sn, Pd, Au, Ag, Pd, Bi, Zn, and the like, or a plating of an alloy including the metal.

The plating layer may include a plurality of layers. The plating layer preferably includes a two-layer structure including a first plating layer provided on the surface of the baked layer and a second plating layer provided on the surface of the first plating layer, for example.

Ni is preferably included in the first plating layer. If the inner electrodes 18 include Ni, Cu, which includes good joinability to Ni, is preferably included in the first plating layer, for example.

The second plating layer may include a plurality of layers, and preferably includes a two-layer structure including a Ni plating layer and a Sn plating layer. The Ni plating layer is included to prevent the base electrode layer from being eroded by solder applied during mounting the multilayer ceramic capacitor. The Sn plating layer is included to increase the wettability of the solder applied during mounting the multilayer ceramic capacitor, to allow the multilayer ceramic capacitor to be easily mounted. The second plating layer is formed as desired, and the outer electrode 14 may be provided directly on the multilayer body 12 and include a plating layer connected directly to the inner electrode 18, that is, the first plating layer. However, as pretreatment, a catalyst may be provided on the multilayer body 12, for example.

In addition, the second plating layer may be provided as an outermost layer of the plating layer, and another plating layer may be provided on the second plating layer.

Each layer of the plating layer preferably includes a thickness of not less than about 1 μm and not greater than about 10 μm, for example. In addition, the plating layer preferably does not include glass. Furthermore, the plating layer preferably includes a metal proportion per unit volume of not less than about 99 vol %, for example. Moreover, the plating layer is obtained by grain growth along the thickness direction, and is columnar or substantially columnar.

The dimension of the multilayer ceramic capacitor 10 in the length direction L is defined as a dimension L, the dimension, in the thickness direction T, of the multilayer ceramic capacitor 10 including the multilayer body 12, the first outer electrode 14a, and the second outer electrode 14b is defined as a dimension T, and the dimension, in the width direction W, of the multilayer ceramic capacitor 10 including the multilayer body 12, the first outer electrode 14a, and the second outer electrode 14b is defined as a dimension W.

The dimension of the multilayer body 12 is not particularly limited, but, preferably, the dimension L in the length direction L is not less than about 0.38 mm and not greater than about 3.50 mm, the dimension W in the width direction W is not less than about 0.18 mm and not greater than about 2.80 mm, and the dimension T in the thickness direction T is not less than about 0.18 mm and not greater than about 2.80 mm, for example. The dimensions of the multilayer ceramic capacitor 10 may be measured with a microscope, for example.

In the multilayer ceramic capacitor 10, when the length of the first outer electrode side surface portions 26a and the second outer electrode side surface portions 26b in the direction connecting the first principal surface 12a and the second principal surface 12b is indicated by A, and the length of the multilayer body 12 in the direction connecting the first principal surface 12a and the second principal surface 12b is indicated by B, 0.063≤A/B≤1.000 is satisfied. Thus, tilt of the multilayer ceramic capacitor 10 when the multilayer ceramic capacitor 10 is mounted on the circuit board or the like is able to be significantly reduced or prevented.

As a result of providing the outer electrode side surface portions on each side surface, a down force acts when the joining material melts in mounting the multilayer ceramic capacitor 10. Accordingly, the attitude of the multilayer ceramic capacitor 10 is able to be stabilized. Regarding the down force, there are four locations at which the down force occurs and the number of which is higher by two than that in a multilayer ceramic capacitor including a structure provided with a turn-up at each end portion. Thus, tilt of the multilayer ceramic capacitor 10 in mounting the multilayer ceramic capacitor 10 is more effectively reduced or prevented, and thus the down force becomes great.

According to the features described above, with the multilayer ceramic capacitor 10, tilt of the multilayer ceramic capacitor 10 during mounting the multilayer ceramic capacitor 10 is able to be significantly reduced or prevented.

In the multilayer ceramic capacitor 10, when the length of the first outer electrode side surface portion 26a and the second outer electrode side surface portion 26b in the direction connecting the first end surface 12e and the second end surface 12f is indicated by C, and the length of the multilayer body 12 in the direction connecting the first end surface 12e and the second end surface 12f is indicated by D, 0.11≤C/D≤0.49 is satisfied. Thus, tilt of the multilayer ceramic capacitor 10 during mounting the multilayer ceramic capacitor 10 on the circuit board or the like is able to be further significantly reduced or prevented.

As a result of providing the outer electrode side surface portions on each side surface, a down force acts when the joining material melts in mounting the multilayer ceramic capacitor 10. Accordingly, the attitude of the multilayer ceramic capacitor 10 is able to be stabilized.

Second Preferred Embodiment

Figure 4:
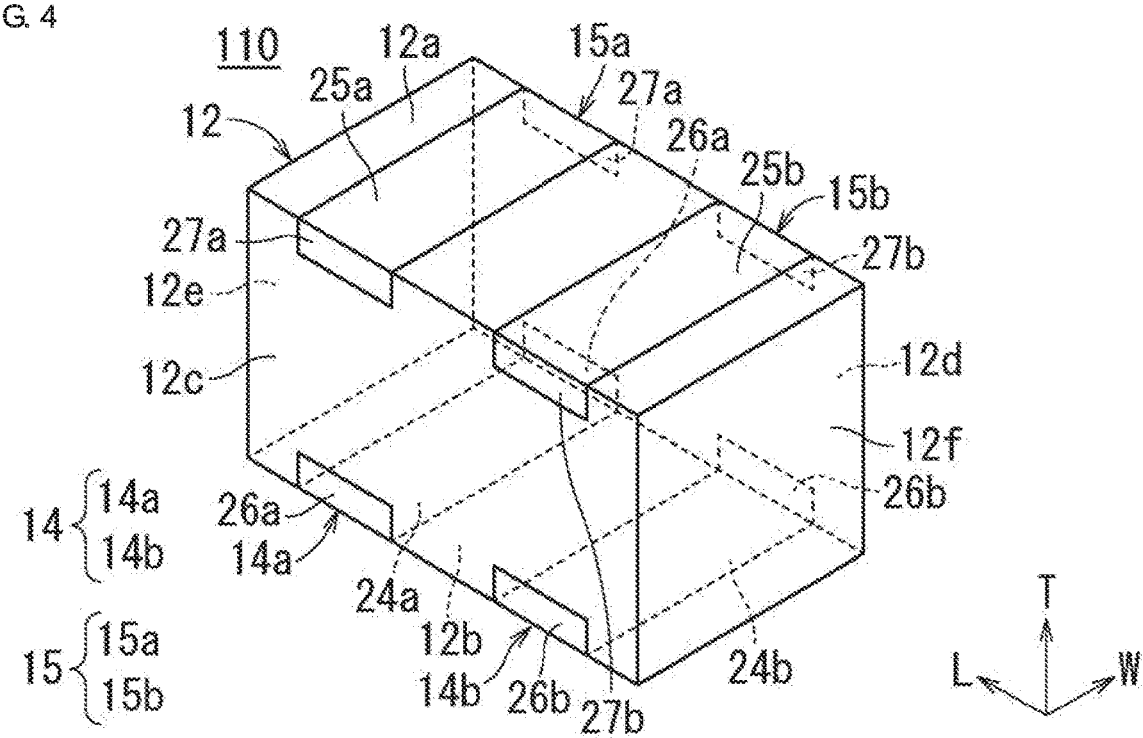
FIG. 4 is an external perspective view showing a multilayer ceramic capacitor according to a second preferred embodiment of the present invention.
Figure 5:
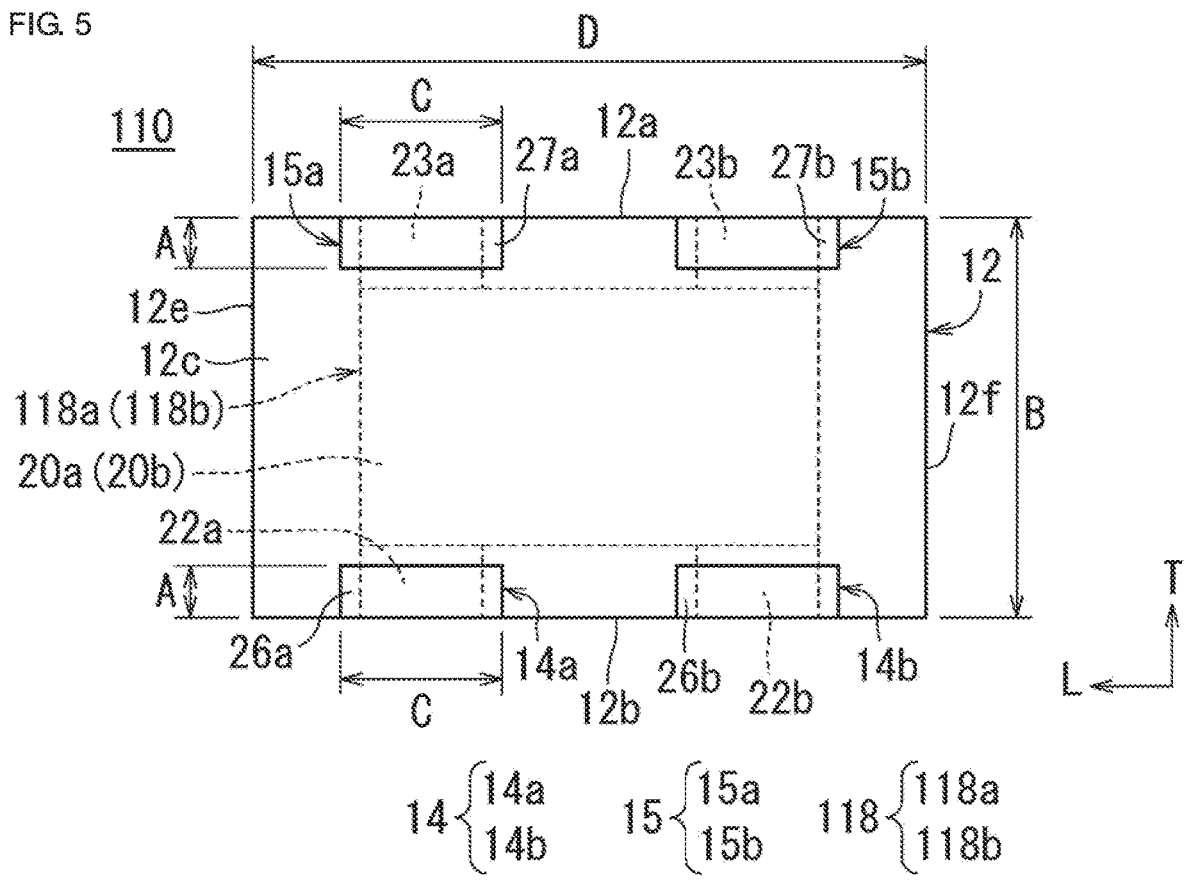
FIG. 5 is a front view of the multilayer ceramic capacitor shown in FIG. 4.
Figure 6:
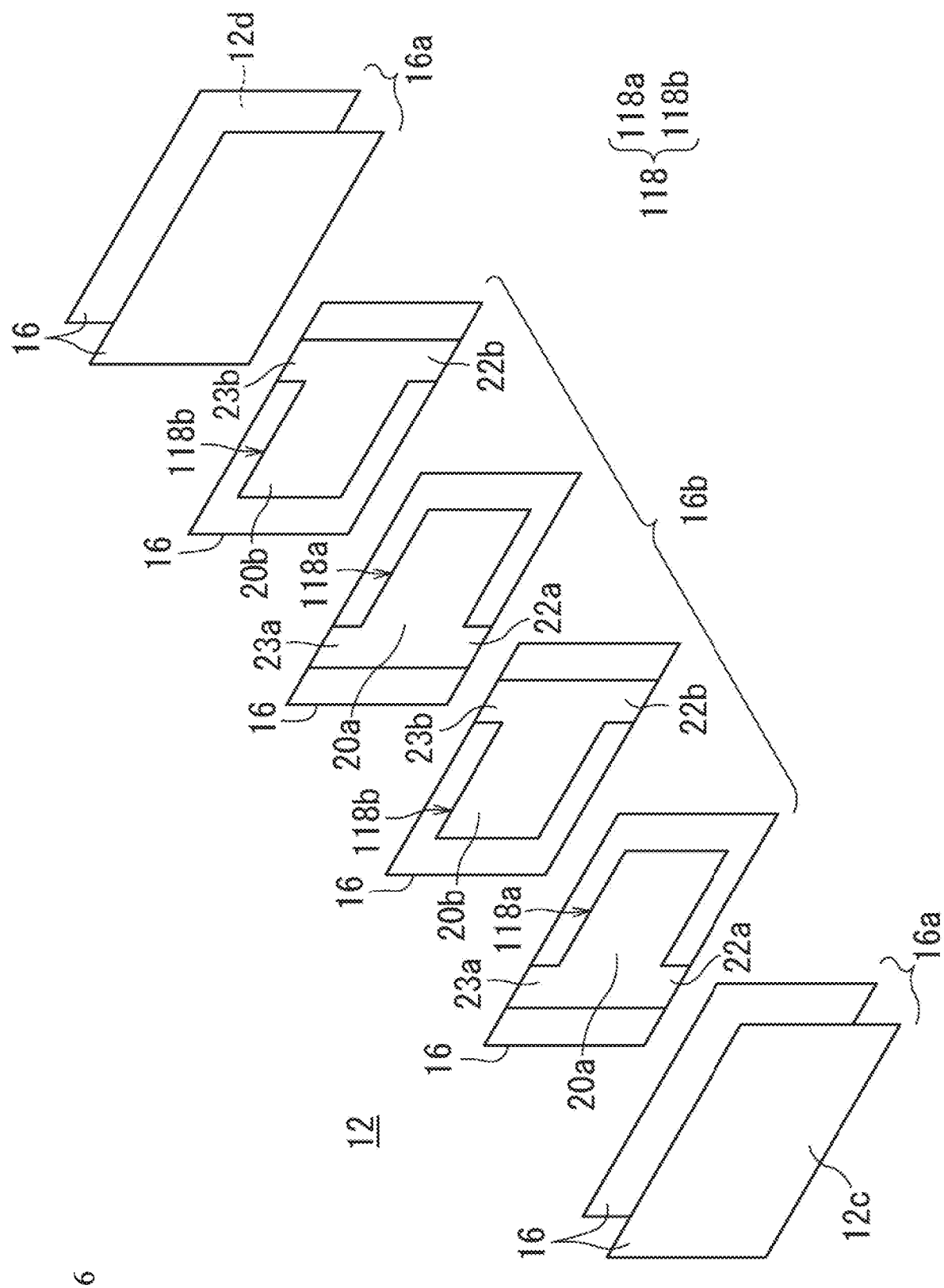
FIG. 6 is an exploded perspective view of a multilayer body shown in FIGS. 4 and 5.

Next, a multilayer ceramic electronic component according to a second preferred embodiment of the present invention is described below. In the second preferred embodiment, a multilayer ceramic capacitor is shown as an example of the multilayer ceramic electronic component. FIG. 4 is an external perspective view of the multilayer ceramic capacitor according to the second preferred embodiment, and FIG. 5 is a front view of the multilayer ceramic capacitor shown in FIG. 4. FIG. 6 is an exploded perspective view of a multilayer body shown in FIGS. 4 and 5. In the multilayer ceramic capacitor 110 shown in FIGS. 4 to 6, the same or similar portions as those in the multilayer ceramic capacitor 10 shown in FIGS. 1 to 3 are designated by the same reference characters, and the description thereof is omitted.

The configuration of the multilayer ceramic capacitor 110 shown in FIGS. 4 to 6 differs from the configuration of the multilayer ceramic capacitor 10 shown in FIGS. 1 to 3, in that inner electrodes 118 extend to both principal surfaces 12a and 12b and thus an outer electrode 15 is located on the first principal surface 12a.

The multilayer ceramic capacitor 110 preferably includes a multilayer body 12 including a rectangular or substantially rectangular parallelepiped shape; and outer electrodes 14 and 15.

The multilayer body 12 includes a plurality of ceramic layers 16 and a plurality of inner electrodes 118.

As shown in FIGS. 5 and 6, the multilayer body 12 of the multilayer ceramic capacitor 110 includes a plurality of first inner electrodes 118a and a plurality of second inner electrodes 118b as the plurality of inner electrodes 118. Each first inner electrode 118a includes a first opposing electrode portion 20a opposing a first side surface 12c and a second side surface 12d and is laminated in a direction connecting the first side surface 12c and the second side surface 12d. Each second inner electrode 118b includes a second opposing electrode portion 20b opposing the first side surface 12c and the second side surface 12d and is laminated in the direction connecting the first side surface 12c and the second side surface 12d. Therefore, the first inner electrodes 118a and the second inner electrodes 118b are located perpendicular or substantially perpendicular to a first principal surface 12a and a second principal surface 12b of the multilayer body 12. The first inner electrodes 118a and the second inner electrodes 118b are laminated alternately with each other within the multilayer body 12, and the first opposing electrode portions 20a of the first inner electrodes 118a and the second opposing electrode portions 20b of the second inner electrodes 118b oppose each other.

Each first inner electrode 118a extends to the second principal surface 12b of the multilayer body 12 by a first extended electrode portion 22a and extends to the first principal surface 12a of the multilayer body 12 by a first extended electrode portion 23a. The first extended electrode portions 22a and 23a extend to the first end surface 12e side of the multilayer body 12. Each second inner electrode 118b extends to the second principal surface 12b of the multilayer body 12 by a second extended electrode portion 22b and extends to the first principal surface 12a of the multilayer body 12 by a second extended electrode portion 23b. The second extended electrode portion 22b extends to the second end surface 12f side of the multilayer body 12 and is spaced apart from the first extended electrode portion 22a, and the second extended electrode portion 23b extends to the second end surface 12f side of the multilayer body 12 and is spaced apart from the first extended electrode portion 23a. The first inner electrodes 118a and the second inner electrodes 118b are not exposed on both side surfaces 12c and 12d and both end surfaces 12e and 12f.

The outer electrode 14 is located on the second principal surface 12b of the multilayer body 12, and the outer electrode 15 is located on the first principal surface 12a of the multilayer body 12. The outer electrode 14 includes a first outer electrode 14a electrically connected to the first extended electrode portions 22a and a second outer electrode 14b electrically connected to the second extended electrode portions 22b. The outer electrode 15 includes a first outer electrode 15a electrically connected to the first extended electrode portions 23a and a second outer electrode 15b electrically connected to the second extended electrode portions 23b.

The first outer electrode 14a includes a first outer electrode principal surface portion 24a located on the second principal surface 12b and first outer electrode side surface portions 26a extending from the first outer electrode principal surface portion 24a and located on the first side surface 12c and the second side surface 12d, respectively.

The second outer electrode 14b includes a second outer electrode principal surface portion 24b located on the second principal surface 12b and second outer electrode side surface portions 26b extending from the second outer electrode principal surface portion 24b and located on the first side surface 12c and the second side surface 12d, respectively.

The first outer electrode 15a includes a first outer electrode principal surface portion 25a located on the first principal surface 12a and first outer electrode side surface portions 27a extending from the first outer electrode principal surface portion 25a and located on the first side surface 12c and the second side surface 12d, respectively.

The second outer electrode 15b includes a second outer electrode principal surface portion 25b located on the first principal surface 12a and second outer electrode side surface portions 27b extending from the second outer electrode principal surface portion 25b and located on the first side surface 12c and the second side surface 12d, respectively.

The first outer electrode principal surface portion 24a of the first outer electrode 14a is located on the second principal surface 12b of the multilayer body 12 and along the first end surface 12e, and the first outer electrode principal surface portion 25a of the first outer electrode 15a is located on the first principal surface 12a of the multilayer body 12 and along the first end surface 12e. In addition, the second outer electrode principal surface portion 24b of the second outer electrode 14b is located along the second end surface 12f and spaced apart from the first outer electrode principal surface portion 24a, and the second outer electrode principal surface portion 25b of the second outer electrode 15b is located along the second end surface 12f and spaced apart from the first outer electrode principal surface portion 25a.

When the length of the first outer electrode side surface portions 26a and 27a and the second outer electrode side surface portions 26b and 27b in a direction connecting the first principal surface 12a and the second principal surface 12b is indicated by A, and the length of the multilayer body 12 in the direction connecting the first principal surface 12a and the second principal surface 12b is indicated by B, $0.063 \leq A/B \leq 1.000$ is satisfied. By setting the range of A/B to $0.063 \leq A/B \leq 1.000$, tilt of the multilayer ceramic capacitor 10 when the multilayer ceramic capacitor 10 is mounted on a circuit board or the like is able to be significantly reduced or prevented. As a result of providing the first outer electrode side surface portions 26a and 27a and the second outer electrode side surface portions 26b and 27b on each side surface, a down force acts when a joining material melts in mounting the multilayer ceramic capacitor 10. Accordingly, the attitude of the multilayer ceramic capacitor 10 is able to be stabilized. In addition, from the standpoint of compact mounting, by setting the range of A/B to $0.063 \leq A/B \leq 0.438$, wetting-up of the joining material to the multilayer ceramic capacitor 10 when the multilayer ceramic capacitor 10 is mounted on the circuit board or the like is able to be significantly reduced or prevented, and a space to mount the multilayer ceramic capacitor 10 is able to be reduced.

The process for measuring the dimension A and the dimension B is the same or substantially the same as the process described in the first preferred embodiment.

When the length of the first outer electrode side surface portions 26a and 27a and the second outer electrode side surface portions 26b and 27b in a direction connecting the first end surface 12e and the second end surface 12f is indicated by C, and the length of the multilayer body 12 in the direction connecting the first end surface 12e and the second end surface 12f is indicated by D, $0.11 \leq C/D \leq 0.49$ is satisfied. When C/D is less than about 0.11, a down force acting when the joining material melts does not occur with respect to the size of the multilayer ceramic capacitor 10, tilt of the multilayer ceramic capacitor 10 when the multilayer ceramic capacitor 10 is mounted on the circuit board is not able to be significantly reduced or prevented. When C/D is greater than about 0.49, an electrode including a length equal or substantially equal to half the side surface length of the multilayer body has to be formed, but is not able to be formed due to a structural reason (a short circuit occurs).

The process for measuring the dimension C and the dimension D is the same or substantially the same as the process described in the first preferred embodiment.

Each of the outer electrodes 14 and 15 preferably includes a base electrode layer and a plating layer in order from the multilayer body 12 side.

In the multilayer ceramic capacitor 110, the same or similar advantages as those of the multilayer ceramic capacitor 10 described above are provided, and the following advantages are also provided.

Specifically, in the multilayer ceramic capacitor 110, since the outer electrode 15 is located on the first principal surface 12a of the multilayer body 12 and the outer electrode 14 is located on the second principal surface 12b, any of the first principal surface 12a side and the second principal surface 12b side is able to be provided as a mounting surface. Thus, direction selection upon mounting is unnecessary. Therefore, the multilayer ceramic capacitor 110 is able to be efficiently mounted on the circuit board.

Next, a non-limiting example of a manufacturing method for the multilayer ceramic electronic component is described below. Hereinafter, a manufacturing method for the multilayer ceramic capacitor 10 will be mainly described.

First, a ceramic green sheet and a conductive paste for inner electrodes are prepared. Each of the ceramic green sheet and the conductive paste for inner electrodes includes a binder, for example, an organic binder, and a solvent, for example, an organic solvent.

Next, the conductive paste for inner electrodes is applied to the ceramic green sheet in a predetermined pattern by, for example, screen printing, gravure printing, or the like, to form an inner electrode pattern. Ceramic green sheets, for inner layers, on each of which an inner electrode pattern includes been printed are produced. In addition, ceramic green sheets, for outer layers, on each of which no inner electrode is printed are also produced.

Then, a predetermined number of the ceramic green sheets, for outer layers, on each of which no inner electrode pattern is printed are stacked, and the ceramic green sheets, for inner layers, on each of which an inner electrode pattern includes been printed are sequentially stacked on the surface of the outer layers, and a predetermined number of the ceramic green sheets, for outer layers, on each of which no inner electrode pattern is printed are stacked on the surface of the inner layers, thus providing a multilayer sheet.

Furthermore, the multilayer sheet is pressed in a stacking direction by an isostatic-pressure press or the like to produce a multilayer block.

Subsequently, the multilayer block is cut into a predetermined size to provide a multilayer chip. At this time, each corner and each edge portion of the multilayer chip may be rounded by barrel polishing or the like.

Next, the multilayer chip is baked to provide a multilayer body. The baking temperature depends on the ceramic material and the material of inner electrodes, but is preferably not lower than about 900° C. and not higher than about 1300° C., for example.

The first extended electrode portions 22a of the first inner electrodes 18a are exposed form the second principal surface 12b of the multilayer body 12. Then, the base electrode layer of the first outer electrode 14a covers the first extended electrode portions 22a of the first inner electrodes 18a exposed from the second principal surface 12b of the multilayer body 12. In addition, the second extended electrode portions 22b of the second inner electrodes 18b are exposed from the second principal surface 12b of the multilayer body 12. Then, the base electrode layer of the second outer electrode 14b covers the second extended electrode portions 22b of the second inner electrodes 18b exposed from the second principal surface 12b of the multilayer body 12.

To form the base electrode layer of the first outer electrode 14a, for example, a conductive paste for outer electrodes is applied to the exposed portions of the first extended electrode portions 22a of the first inner electrode 18a exposed from the second principal surface 12b of the multilayer body 12, and baked. In addition, similarly, to form the base electrode layer of the second outer electrode 14b, for example, the conductive paste for outer electrodes is applied to the exposed portions of the second extended electrode portions 22b of the second inner electrodes 18b exposed from the second principal surface 12b of the multilayer body 12, and baked. The baking temperature is preferably not lower than about 700° C. and not higher than about 900° C., for example. If desired, a plating film including one or more layers is formed on the base electrode layer. Accordingly, the outer electrode 14 is formed.

To form the base electrode layer of the first outer electrode 14a, for example, the exposed portions of the first extended electrode portions 22a of the first inner electrodes 18a exposed from the second principal surface 12b of the multilayer body 12 may be plated. Similarly, to form the base electrode layer of the second outer electrode 14b, for example, the exposed portions of the second extended electrode portions 22b of the second inner electrodes 18b exposed from the second principal surface 12b of the multilayer body 12 may be plated. As the plating process, either electrolytic plating or electroless plating may be used. One issue with electroless plating is that a pretreatment with a catalyst or the like is typically performed to increase a plating deposition rate, and thus includes a process that is complicated. Therefore, normally, electrolytic plating is preferably used. As a plating method, a barrel plating method is preferably performed, for example. If a surface conductor is formed, a surface conductor pattern may be printed in advance on the surface of the outermost ceramic green sheet and may be baked simultaneously or substantially simultaneously with the multilayer body, or a surface conductor may be printed on the principal surface of the baked multilayer body and then may be baked. In addition, if desired, a plating film including one or more layers is formed on the surface of the base electrode layer. Accordingly, the outer electrode 14 is formed.

As described above, the multilayer ceramic capacitor 10 shown in FIG. 1 is manufactured.

The advantageous effects of the multilayer ceramic electronic component obtained as described above will become apparent also from the experimental examples described below.

Hereinafter, the experimental examples conducted by the inventors for confirming the advantageous effects of the preferred embodiments of present invention will be described.

Experimental Example 1

In Experimental Example 1, for a multilayer ceramic capacitor, the stability of the attitude of the multilayer ceramic capacitor when the multilayer ceramic capacitor was mounted on a circuit board was evaluated by a relationship between the length (dimension A) of the first outer electrode side surface portion and the second outer electrode side surface portion in the direction connecting the first principal surface and the second principal surface and the length (dimension B) of the multilayer body in the direction connecting the first principal surface and the second principal surface.

The specifications of multilayer ceramic capacitors of test samples 1-1 to 1-11 and test samples 2-1 to 2-11 prepared for the evaluation described above are as follows. FIG. 7A is an external perspective view of the multilayer ceramic capacitor of test sample 1-1 included in Experimental Example 1, FIG. 7B is an external perspective view of the multilayer ceramic capacitor of test sample 1-3 included in Experimental Example 1, and FIG. 7C is an external perspective view of the multilayer ceramic capacitor of test sample 1-11 included in Experimental Example 1. The dimensions such as size are designed values. As the sizes of the multilayer ceramic capacitors, two types were prepared. The number of samples of each test sample was 50.

Size: L×W×T=3.2 mm×1.6 mm×1.6 mm (test samples 1-1 to 1-11)
L×W×T=1.6 mm×0.8 mm×0.8 mm (test samples 2-1 to 2-11)
Material of Ceramic Layers: $BaTiO_3$
Material of Inner Electrodes: Ni
Structure of Outer Electrodes:
  Baked Layers: Applying and Baking a Paste Including Metal Powder (Cu) and Glass
  Plating Layers: Two-Layer Structure Including a Ni Plating Layer and a Sn Plating Layer Each test sample was mounted on a glass epoxy substrate as a circuit board by including eutectic or LF solder. Thereafter, the test sample and the circuit board were captured by a camera of a stereoscopic microscope from the end surface direction of the multilayer ceramic capacitor, and the angle defined between a normal line in the direction perpendicular or substantially perpendicular to the circuit board and a line parallel or substantially parallel to the side surfaces of the multilayer ceramic capacitor was measured. As a result of the angle measurement, the test sample including a sample with a tilt of 3.0° or higher was evaluated as NG.

The multilayer ceramic capacitor, that is, each sample of each test sample, was observed with a microscope, and the height (dimension A) of a central portion, in the length direction L, of each of the first outer electrode side surface portion and the second outer electrode side surface portion of the multilayer ceramic capacitor and the height (dimension B) of a central portion, in the length direction, of the first side surface of the multilayer body were measured by performing a dimension measuring operation. The dimension A was determined as the average of the value of the first outer electrode side surface portion 26a and the value of the second outer electrode side surface portion 26b.

If the second principal surface of the multilayer body was located at the lower side and the first side surface was seen, a normal line was created with respect to a line parallel or substantially parallel to the first principal surface and the second principal surface, and the dimension A and the dimension B parallel or substantially parallel to the normal line were measured.

Table 1 shows the evaluation results of a tilt test for A/B of each of test samples 1-1 to 1-11, and Table 2 shows the evaluation results of a tilt test for A/B of each of test samples 2-1 to 2-11. In each table, each test sample marked with * is outside the range of the preferred embodiments of the present invention.

TABLE 1

|   | Dimension A (mm) | Dimension B (mm) | A/B | Results of Tilt Test |
| --- | --- | --- | --- | --- |
| * Test Sample 1-1 | 0.04 | 1.6 | 0.025 | NG (20/50) |
| * Test Sample 1-2 | 0.08 | 1.6 | 0.050 | NG (13/50) |
| Test Sample 1-3 | 0.10 | 1.6 | 0.063 | G (0/50) |
| Test Sample 1-4 | 0.30 | 1.6 | 0.188 | G (0/50) |
| Test Sample 1-5 | 0.50 | 1.6 | 0.313 | G (0/50) |
| Test Sample 1-6 | 0.70 | 1.6 | 0.438 | G (0/50) |
| Test Sample 1-7 | 0.90 | 1.6 | 0.563 | G (0/50) |
| Test Sample 1-8 | 1.00 | 1.6 | 0.625 | G (0/50) |
| Test Sample 1-9 | 1.20 | 1.6 | 0.750 | G (0/50) |
| Test Sample 1-10 | 1.50 | 1.6 | 0.938 | G (0/50) |
| Test Sample 1-11 | 1.60 | 1.6 | 1.000 | G (0/50) |

TABLE 2

|   | Dimension A (mm) | Dimension B (mm) | A/B | Results of Tilt Test |
| --- | --- | --- | --- | --- |
| * Test Sample 2-1 | 0.01 | 0.8 | 0.013 | NG (37/50) |
| * Test Sample 2-2 | 0.03 | 0.8 | 0.038 | NG (23/50) |
| Test Sample 2-3 | 0.05 | 0.8 | 0.063 | G (0/50) |
| Test Sample 2-4 | 0.07 | 0.8 | 0.088 | G (0/50) |
| Test Sample 2-5 | 0.10 | 0.8 | 0.125 | G (0/50) |
| Test Sample 2-6 | 0.20 | 0.8 | 0.250 | G (0/50) |
| Test Sample 2-7 | 0.30 | 0.8 | 0.375 | G (0/50) |
| Test Sample 2-8 | 0.40 | 0.8 | 0.500 | G (0/50) |
| Test Sample 2-9 | 0.50 | 0.8 | 0.625 | G (0/50) |
| Test Sample 2-10 | 0.65 | 0.8 | 0.813 | G (0/50) |
| Test Sample 2-11 | 0.80 | 0.8 | 1.000 | G (0/50) |

From the results shown in Tables 1 and 2, each of test samples 1-3 to 1-11 and test samples 2-3 to 2-11 includes outer electrode side surface portions located also on portions of the first and second side surfaces, and $0.063 \leq A/B \leq 1.000$ is satisfied when the length of the outer electrode side surface portions in the direction connecting the first principal surface and the second principal surface is indicated by A and the length of the multilayer body in the direction connecting the first principal surface and the second principal surface is indicated by B. Thus, tilt in mounting is confirmed to be significantly reduced or prevented.

As a result of providing predetermined outer electrode side surface portions on each side surface, a down force acts when a joining material melts in mounting the multilayer ceramic capacitor. Accordingly, the attitude of the multilayer ceramic capacitor is able to be stabilized.

In the structure of the preferred embodiments of present invention, there are four locations at which the down force occurs and the number of which is higher by two than that in a multilayer ceramic capacitor including a structure provided with a turn-up at each end portion. Thus, tilt in mounting the multilayer ceramic capacitor is effectively reduced or prevented. Therefore, tilt of the multilayer ceramic capacitor during mounting the multilayer ceramic capacitor is able to be significantly reduced or prevented.

Experimental Example 2

In Experimental Example 2, for a multilayer ceramic capacitor, the stability of the attitude of the multilayer ceramic capacitor when the multilayer ceramic capacitor was mounted on a circuit board was evaluated by a relationship between the length (dimension C) of the first outer electrode side surface portion and the second outer electrode side surface portion in the direction connecting the first end surface and the second end surface and the length (dimension D) of the multilayer body in the direction connecting the first end surface and the second end surface.

The specifications of multilayer ceramic capacitors of test samples 3-1 to 3-12 and test samples 4-1 to 4-10 prepared for the evaluation described above are as follows. The dimensions such as size are designed values. As the sizes of the multilayer ceramic capacitors, two types were prepared. The number of samples of each test sample was 50.

Size: L×W×T=3.2 mm×1.6 mm×1.6 mm (test samples 3-1 to 3-12)
L×W×T=1.6 mm×0.8 mm×0.8 mm (test samples 4-1 to 4-10)
Material of Ceramic Layers: $BaTiO_3$
Material of Inner Electrodes: Ni
Structure of Outer Electrodes:
Baked Layers: Applying and Baking a Paste Including Metal Powder (Cu) and Glass
Plating Layers: Two-Layer Structure Including a Ni Plating Layer and a Sn Plating Layer Each test sample was mounted on a glass epoxy substrate as a circuit board by using eutectic or LF solder. Thereafter, the test sample and the circuit board were captured by a camera of a stereoscopic microscope from the end surface direction of the multilayer ceramic capacitor, and the angle formed between a normal line in the direction perpendicular or substantially perpendicular to the circuit board and a line parallel or substantially parallel to the side surfaces of the multilayer ceramic capacitor was measured. As a result of the angle measurement, the test sample including a sample with a tilt of 3.0° or higher was evaluated as NG.

The multilayer ceramic capacitor, that is, each sample of each test sample was observed with a microscope, and the length (dimension C), in the length direction L, of each of the first outer electrode side surface portion and the second outer electrode side surface portion of the multilayer ceramic capacitor and the length (dimension D), in the length direction L, of the first side surface of the multilayer body were measured by performing a dimension measuring operation. The dimension C was determined as the average of the value of the first outer electrode side surface portion 26a and the value of the second outer electrode side surface portion 26b.

If the first principal surface or the second principal surface of the multilayer body was seen, a first normal line was created with respect to the first side surface and the second side surface, further a second normal line was created with respect to the first normal line, and the dimension C and the dimension D parallel or substantially parallel to the second normal line were measured.

Table 3 shows the evaluation results of a tilt test for C/D of each of test samples 3-1 to 3-12, and Table 4 shows the evaluation results of a tilt test for C/D of each of test samples 4-1 to 4-10. In each table, each test sample marked with * is outside the range of a preferred embodiments of the present invention.

TABLE 3

| | Dimension C (mm) | Dimension D (mm) | C/D | Results of Tilt Test |
|---|---|---|---|---|
| * Test Sample 3-1 | 0.20 | 3.2 | 0.06 | NG (22/50) |
| * Test Sample 3-2 | 0.30 | 3.2 | 0.09 | NG (11/50) |
| Test Sample 3-3 | 0.35 | 3.2 | 0.11 | G (0/50) |
| Test Sample 3-4 | 0.50 | 3.2 | 0.16 | G (0/50) |
| Test Sample 3-5 | 0.70 | 3.2 | 0.22 | G (0/50) |
| Test Sample 3-6 | 0.90 | 3.2 | 0.28 | G (0/50) |
| Test Sample 3-7 | 1.10 | 3.2 | 0.34 | G (0/50) |
| Test Sample 3-8 | 1.30 | 3.2 | 0.41 | G (0/50) |
| Test Sample 3-9 | 1.40 | 3.2 | 0.44 | G (0/50) |
| Test Sample 3-10 | 1.50 | 3.2 | 0.47 | G (0/50) |
| Test Sample 3-11 | 1.58 | 3.2 | 0.49 | G (0/50) |
| * Test Sample 3-12 | 1.60 | 3.2 | 0.50 | Non-settable |

TABLE 4

| | Dimension C (mm) | Dimension D (mm) | C/D | Results of Tilt Test |
|---|---|---|---|---|
| * Test Sample 4-1 | 0.100 | 1.6 | 0.06 | NG (32/50) |
| * Test Sample 4-2 | 0.150 | 1.6 | 0.09 | NG (18/50) |
| Test Sample 4-3 | 0.170 | 1.6 | 0.11 | G (0/50) |
| Test Sample 4-4 | 0.300 | 1.6 | 0.19 | G (0/50) |
| Test Sample 4-5 | 0.400 | 1.6 | 0.25 | G (0/50) |
| Test Sample 4-6 | 0.500 | 1.6 | 0.31 | G (0/50) |
| Test Sample 4-7 | 0.600 | 1.6 | 0.38 | G (0/50) |
| Test Sample 4-8 | 0.700 | 1.6 | 0.44 | G (0/50) |
| Test Sample 4-9 | 0.785 | 1.6 | 0.49 | G (0/50) |
| * Test Sample 4-10 | 0.800 | 1.6 | 0.50 | Non-settable |

From the results shown in Tables 3 and 4, in each of test samples 3-3 to 3-11 and test samples 4-3 to 4-9, $0.11 \leq C/D \leq 0.49$ is satisfied when the length of the outer electrode side surface portions in the direction connecting the first end surface and the second end surface is indicated by C and the length of the multilayer body in the direction connecting the first end surface and the second end surface is indicated by D. Thus, tilt in mounting is confirmed to be significantly reduced or prevented.

As a result of providing predetermined outer electrode side surface portions on each side surface, a down force acts when a joining material melts in mounting the multilayer ceramic capacitor. Accordingly, the attitude of the multilayer ceramic capacitor is able to be stabilized.

The present invention is not limited to the preferred embodiments described above, and is able to be modified in a variety of ways within the scope of the present invention.

In the multilayer ceramic electronic component, as long as $0.063 \leq A/B \leq 1.000$ is satisfied when the length of the outer electrode side surface portions in the direction connecting the first principal surface and the second principal surface is indicated by A and the length of the multilayer body in the direction connecting the first principal surface and the second principal surface is indicated by B, $0.11 \leq C/D \leq 0.49$ does not need to be necessarily satisfied when the length of the outer electrode side surface portions in the direction connecting the first end surface and the second end surface is indicated by C and the length of the multilayer body in the direction connecting the first end surface and the second end surface is indicated by D.

While preferred embodiments of the present invention have been described above, it is to be understood that variations and modifications will be apparent to those skilled in the art without departing from the scope and spirit of the invention. The scope of the present invention, therefore, is to be determined solely by the following claims.

What is claimed is:
1. A multilayer ceramic electronic component comprising:
   a multilayer body including a plurality of laminated ceramic layers and including a first principal surface and a second principal surface opposing each other, a first side surface and a second side surface opposing each other in a lamination direction of the multilayer body, and a first end surface and a second end surface opposing each other, the first principal surface or the second principal surface defining and functioning as a mounting surface;
   a first inner electrode located within the multilayer body and partially extended to only one of the first or second principal surface at the first end surface side;
   a second inner electrode located within the multilayer body and partially extended to only one of the first or second principal surface at the second end surface side at a position different from that of the first inner electrode;
   a first outer electrode located on the first or second principal surface and connected to the first inner electrode on the first or second principal surface; and
   a second outer electrode located on the first or second principal surface and connected to the second inner electrode on the first or second principal surface; wherein
   the first outer electrode includes a first outer electrode side surface portion located on the first or second principal surface and portions of the first side surface and the second side surface;
   the second outer electrode includes a second outer electrode side surface portion located on the first or second principal surface and portions of the first side surface and the second side surface;
   $0.063 \leq A/B \leq 1.000$ is satisfied when a length of the first outer electrode side surface portion and the second outer electrode side surface portion in a direction connecting the first principal surface and the second principal surface is indicated by A and a length of the multilayer body in the direction connecting the first principal surface and the second principal surface is indicated by B; and $0.11 \leq C/D \leq 0.49$ is satisfied when a length of the first outer electrode side surface portion and the second outer electrode side surface portion in a direction connecting the first end surface and the second end surface is indicated by C and a length of the multilayer body in the direction connecting the first end surface and the second end surface is indicated by D.

2. The multilayer ceramic electronic component according to claim 1, wherein the laminated ceramic layers include a piezoelectric ceramic, and the multilayer ceramic electronic component defines and functions as a ceramic piezoelectric element.

3. The multilayer ceramic electronic component according to claim 1, wherein the laminated ceramic layers include a semiconductor ceramic, and the multilayer ceramic electronic component defines and functions as a thermistor element.

4. The multilayer ceramic electronic component according to claim 1, wherein the laminated ceramic layers include a magnetic ceramic, and the multilayer ceramic electronic component defines and functions as an inductor element.

5. The multilayer ceramic electronic component according to claim 1, wherein at least one gap is provided in the multilayer body between the first end surface and the second end surface.

6. The multilayer ceramic electronic component according to claim 1, wherein the first outer electrode and the second outer electrode include a base electrode layer and a plating layer.

7. The multilayer ceramic electronic component according to claim 6, wherein the base electrode layer includes at least one of a baked layer, a resin layer, and a thin film layer.

8. The multilayer ceramic electronic component according to claim 6, wherein the plating layer includes a two-layer structure.

9. A multilayer ceramic electronic component comprising:
a multilayer body including a plurality of laminated ceramic layers and including a first principal surface and a second principal surface opposing each other, a first side surface and a second side surface opposing each other in a lamination direction of the multilayer body, and a first end surface and a second end surface opposing each other, the first principal surface or the second principal surface defining and functioning as a mounting surface;
a first inner electrode located within the multilayer body and partially extended to the first and second principal surfaces at the first end surface side;
a second inner electrode located within the multilayer body and partially extended to the first and second principal surfaces at the second end surface side at a position different from that of the first inner electrode;
a first outer electrode located on the first and second principal surfaces and connected to the first inner electrode on the first and second principal surfaces; and
a second outer electrode located on the first and second principal surfaces and connected to the second inner electrode on the first and second principal surfaces; wherein
the first outer electrode includes a first outer electrode side surface portion located on the first and second principal surfaces and portions of the first side surface and the second side surface;
the second outer electrode includes a second outer electrode side surface portion located on the first and second principal surfaces and portions of the first side surface and the second side surface;
$0.063 \leq A/B \leq 1.000$ is satisfied when a length of the first outer electrode side surface portion and the second outer electrode side surface portion in a direction connecting the first principal surface and the second principal surface is indicated by A and a length of the multilayer body in the direction connecting the first principal surface and the second principal surface is indicated by B; and
$0.11 \leq C/D \leq 0.49$ is satisfied when a length of the first outer electrode side surface portion and the second outer electrode side surface portion in a direction connecting the first end surface and the second end surface is indicated by C and a length of the multilayer body in the direction connecting the first end surface and the second end surface is indicated by D.

10. The multilayer ceramic electronic component according to claim 9, wherein the laminated ceramic layers include a piezoelectric ceramic, and the multilayer ceramic electronic component defines and functions as a ceramic piezoelectric element.

11. The multilayer ceramic electronic component according to claim 9, wherein the laminated ceramic layers include a semiconductor ceramic, and the multilayer ceramic electronic component defines and functions as a thermistor element.

12. The multilayer ceramic electronic component according to claim 9, wherein the laminated ceramic layers include a magnetic ceramic, and the multilayer ceramic electronic component defines and functions as an inductor element.

13. The multilayer ceramic electronic component according to claim 9, wherein at least one gap is provided in the multilayer body between the first end surface and the second end surface.

14. The multilayer ceramic electronic component according to claim 9, wherein the first outer electrode and the second outer electrode include a base electrode layer and a plating layer.

15. The multilayer ceramic electronic component according to claim 14, wherein the base electrode layer includes at least one of a baked layer, a resin layer, and a thin film layer.

16. The multilayer ceramic electronic component according to claim 14, wherein the plating layer includes a two-layer structure.

* * * * *